United States Patent
Kresge et al.

(10) Patent No.: US 10,813,228 B2
(45) Date of Patent: Oct. 20, 2020

(54) PREVENTING POST REFLOW INTERCONNECT FAILURES IN VIPPO SOLDER JOINTS VIA UTILIZATION OF ADHESIVE MATERIAL

(71) Applicant: INDIUM CORPORATION, Utica, NY (US)

(72) Inventors: Lee C. Kresge, Utica, NY (US); Elaina J. Zito, Utica, NY (US); Ning-Cheng Lee, Utica, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

(21) Appl. No.: 16/445,904

(22) Filed: Jun. 19, 2019

(65) Prior Publication Data

US 2019/0394883 A1 Dec. 26, 2019

Related U.S. Application Data

(60) Provisional application No. 62/689,025, filed on Jun. 22, 2018.

(51) Int. Cl.
*H05K 3/46* (2006.01)
*H05K 1/14* (2006.01)
(Continued)

(52) U.S. Cl.
CPC .......... *H05K 3/305* (2013.01); *H05K 1/0201* (2013.01); *H05K 1/113* (2013.01); *H05K 1/181* (2013.01); *H05K 3/321* (2013.01); *H05K 3/3436* (2013.01); *H05K 3/3494* (2013.01); *H05K 3/42* (2013.01); *H05K 2201/09572* (2013.01); *H05K 2201/10734* (2013.01)

(58) Field of Classification Search
CPC .. H05K 3/4611; H05K 3/4614; H05K 3/4617; H05K 3/462; H05K 1/14; H05K 1/144; H05K 3/303; H05K 3/305
See application file for complete search history.

(56) References Cited

U.S. PATENT DOCUMENTS 7,718,256 B1 * 5/2010 Frank ..................... C09J 163/00
428/343
2003/0147227 A1 * 8/2003 Egitto ................. H01L 21/4853
361/795

(Continued)

FOREIGN PATENT DOCUMENTS

WO WO 2006/098294 9/2006

OTHER PUBLICATIONS

International Search Report and Written Opinion dated Oct. 4, 2019 for International Application No. PCT/US2019/038053, filed on Jun. 19, 2019.

*Primary Examiner* — Jeremy C Norris
(74) *Attorney, Agent, or Firm* — Sheppard, Mullin, Richter & Hampton LLP

(57) ABSTRACT

Implementations of the disclosure describe techniques for eliminating or reducing hot tearing in via-in-pad plated over (VIPPO) solder joints by incorporating an adhesive into a printed circuit board assembly (PCBA). In an embodiment, the adhesive is an adhesive containing fluxing agent that prevents tearing by reducing a differential in thermal expansion caused by a coefficient of thermal expansion (CTE) mismatch between a plated metal of the VIPPO pads and the PCB substrate.

19 Claims, 5 Drawing Sheets

(51) Int. Cl.
*H05K 3/30* (2006.01)
*H05K 1/02* (2006.01)
*H05K 1/11* (2006.01)
*H05K 1/18* (2006.01)
*H05K 3/32* (2006.01)
*H05K 3/34* (2006.01)
*H05K 3/42* (2006.01)

(56) References Cited

U.S. PATENT DOCUMENTS

| | | |
|---|---|---|
| 2008/0012140 A1 | 1/2008 | Tsukano et al. |
| 2009/0294993 A1 | 12/2009 | Hsu |
| 2010/0140800 A1 | 6/2010 | Hagihara |
| 2017/0137601 A1* | 5/2017 | Heikkinen ............. C08G 77/14 |
| 2017/0178984 A1* | 6/2017 | Ko ......................... H01L 24/48 |
| 2018/0277489 A1* | 9/2018 | Han ..................... H01L 23/3128 |

* cited by examiner

PREVENTING POST REFLOW INTERCONNECT FAILURES IN VIPPO SOLDER JOINTS VIA UTILIZATION OF ADHESIVE MATERIAL

CROSS-REFERENCE TO RELATED APPLICATIONS

This application claims priority to U.S. Provisional Patent Application No. 62/689,025 filed on Jun. 22, 2018, and titled "PREVENTING POST REFLOW INTERCONNECT FAILURES IN VIPPO SOLDER JOINTS VIA UTILIZATION OF ADHESIVE MATERIAL."

DESCRIPTION OF THE RELATED ART

Through Hole Technology (THT) is an initial build technology for the assembly and mass production of printed circuit boards (PCBs). THT-assembled PCBs do not have significant coefficient of thermal expansion (CTE) problems (e.g., the CTE of a first material differing from the CTE of a second material within the PCB). THT-assembled PCBs are characterized by a mounting scheme used for electronic components involving metal leads inserted through holes drilled through the THT-assembled PCBs and soldered to the pads on the bottom side of the PCB. More specifically, the metal leads of the electronic components in THT-assembled PCBs allow for: (i) reduction of variations between the CTE of different materials within PCBs; and (ii) absorption of stresses (e.g., application of thermal and/or mechanical pressure on surfaces of the PCB) resulting from the different CTE among different electronic components.

As the demand for PCBs with greater electronic circuit densities grew, Surface Mount Technology (SMT) packaging has been utilized for the assembly of PCBs. The components of SMT-assembled PCBs are assembled with the electrical connections on the surface(s) of the PCBs. This allows both the top and bottom surfaces of the PCB unit to be utilized for circuit design and build. In earlier generations of SMT-assembled PCBs, electrical interconnects between the top and bottom surfaces of a PCB unit are externally connected through additional interconnects (e.g., wires, additional physical connectors, etc.).

As SMT-assembled PCBs with electronic circuit densities increased, plated through holes (PTH) packaging has been utilized for the assembly of PCBs. More specifically, the increasing electronic circuit densities necessitated communication between the top and bottom surfaces of a PCB unit. Holes are drilled through the PCBs for the specific purpose of making an electrical connection between the top and bottom surfaces of the PCB unit after plating the inner walls of the hole with copper (Cu). These Plated Through Holes (PTH) facilitate electrical interconnections between the top and bottom surfaces of the PCB unit by providing a conductive pathway through the copper plating inside the via. Electrical traces or other interconnects may then be connected to the PTH.

A ball grid array (BGA) is a type of SMT (e.g., a chip carrier) used for integrated circuits to permanently mount devices such as microprocessors. A BGA can provide more electrical interconnects than can be put on a dual in-line or flat package. The process of soldering BGA components to PCBs requires specialized machinery. The specialized machinery uses interconnection pins composed of solder joints to be melted for establishing the electrical contact with the pads. The whole bottom surface of the device can be used, instead of just the perimeter. The metal leads are also on average shorter than with a perimeter-only type, resulting in better performance at high speeds than other types of PCBAs (e.g., small parasitic inductances present in the joint between the pad and the solder joints). The pads within PCB substrates may adopt a dog-bone structure or the more industry preferred via-in-pad plated over (VIPPO) structure. The VIPPO structure allows for higher performances of PCB/PCBA technology by: (i) shrinking signal path lengths; and (ii) reducing capacitance and inductance parasitic effects.

As PCB designs for high-end networking products increase in complexity, these PCBs exhibit the following characteristics: (i) having a thickness greater than 120 mils; and (ii) containing a combination of VIPPO and non-VIPPO pad structures. Materials with mismatched CTEs lead to surface topologies resembling "hills and valleys" (i.e., non-uniform topology) on the PCB during the assembly of BGAs on PCBs containing a combination of VIPPO and non-VIPPO pads.

A first attempt to remedy assembly failures due to mismatched CTEs contained within PCBs composed of a combination of VIPPO and non-VIPPO pads involves the placement of PTHs at locations away from soldered component interconnects, where the "hills and valleys" surface topology created during secondary heating after reflow would not affect any of the neighboring solder joints. When these PTHs are placed directly underneath the pads used for component attach to provide increased circuit densities they must be plated over to prevent solder starvation of the joint. This is then referred to as a VIPPO pad. Upon assembly of the component on the PCB (i.e., furnishing a PCBA) and heating the PCBA again, the PCBA is limited in expansion underneath the pad where the VIPPO is located, while the rest of the PCB expands at the higher rate determined by the CTE of the bulk PCB material. The first attempt resulted in solder joint failure (e.g., solder joint above a VIPPO to tear when the temperature is near the melting point of a metal solder) due to the mismatch in CTEs between VIPPO and non-VIPPO pads. This is referred to as hot tearing. The hot tearing occurs on the component side because of the component's smaller thermal mass (compared to the PCB substrate) which allows the component to be slightly higher in temperature compared to the PCB. As the solid solder approaches melting temperature, the mechanical strength weakens and the solder detaches from the component side.

A second attempt to remedy assembly failures due to mismatched CTEs contained within PCBs composed of a combination of VIPPO and non-VIPPO pads involves: (i) the application to the edges of the component with underfills (e.g., a polymer applied on the PCB after the PCB has been subjected to reflow); (ii) the adsorption of the underfill by capillary action underneath the component; and (iii) the curing of the underfills. The second attempt requires the underfills to be cured offline and thus, requiring additional processing steps that use up more time and equipment. Additionally, the rework of a bad component or assembly and the handling of components and standoff heights, which are reduced in size, become arduously tedious with this curing reinforcement method. Stated another way, the second attempt is a laborious process to remedy PCBA builds with mismatched CTEs contained within PCB composed of a combination of VIPPO and non-VIPPO pads.

BRIEF SUMMARY OF THE DISCLOSURE

Implementations of the disclosure describe techniques for eliminating or reducing hot tearing in via-in-pad plated over (VIPPO) solder joints by incorporating an adhesive into a printed circuit board assembly (PCBA).

In one embodiment, a method comprises: introducing an adhesive to a printed circuit board (PCB), wherein the PCB comprises a plurality of pads, one of the plurality of pads comprising a through hole with a plated metal; populating the plurality of pads with a plurality of electronic components; forming a printed circuit board assembly (PCBA) by heating and then cooling the plurality of pads populated with the plurality of electronic components, wherein the PCBA comprises a plurality of solder joints, wherein each solder joint of the plurality of solder joints is formed between a respective one of the pads of the plurality of pads and an electronic component of the plurality of electronic components; and after forming the PCBA, heating the PCBA, wherein the adhesive prevents a solder joint coupled to the pad with the through hole from tearing when heating the PCBA.

In some implementations, introducing the adhesive to the PCB, comprises: dipping the plurality of electronic components in the adhesive to yield a plurality of electronic components coated with the adhesive; and populating the plurality of pads with the plurality of electronic components coated with the adhesive.

In some implementations, introducing the adhesive to the PCB, comprises: applying the adhesive onto the PCB to yield a plurality of pads containing the adhesive; and populating the plurality of pads containing the adhesive with the plurality of electronic components.

In some implementations, heating the PCBA, comprises: heating the PCBA to a first elevated temperature from room temperature; heating the PCBA to a second elevated temperature from room temperature; and cooling the PCBA back to room temperature.

In some implementations, the adhesive reduces a differential in thermal expansion caused by a coefficient of thermal expansion (CTE) mismatch between the PCB and the plated metal. In implementations, heating the PCBA to the second elevated temperature from room temperature, comprises transforming the plurality of solder joints to a molten state solder; and maintaining an attachment of the plurality of solder joints to the plurality of pads in the molten state solder. In some implementations, the plated metal comprises at least one of: copper, nickel, gold, solder, a copper alloy, a gold alloy, and a nickel alloy.

In some implementations, heating the PCBA is performed within a range from 150° C. to 300° C.

In some implementations, introducing the adhesive to the PCB, comprises: applying the adhesive onto the plurality of pads containing solder paste to yield a plurality of pads containing the adhesive and the solder paste; and populating the plurality of pads containing the adhesive and the solder paste with the plurality of electronic components.

In some implementations, the adhesive comprises a cross-linking agent, wherein after forming the PCBA, the adhesive is cross-linked.

In some implementations, the adhesive comprises a curing agent, wherein after forming the PCBA, the adhesive is cured.

In some implementations, the method further comprises: cross-linking the adhesive by applying radiation, wherein the radiation comprises at least one of: electron beam radiation and ultraviolet radiation.

In some implementations, the method further comprises: cross-linking the adhesive by exposing the adhesive to at least one of: free-radical initiated reactions, cationic initiated reactions, and anionic initiated reactions.

In some implementations, the plurality of pads comprise via-in-pad plated over (VIPPO) pads and non-VIPPO pads. In some implementations, the VIPPO pads contain at least one of: a copper finish on a surface of the VIPPO pads; a nickel gold finish on the surface of the VIPPO pads; a hot air solder levelling finish on the surface of the VIPPO pads; an electroless nickel with immersion gold coating on the surface of the VIPPO pads; and an organic surface protect (OSP) finish on the surface of the VIPPO pads.

In some implementations, forming the PCBA by heating comprises: convection heating; infra-red heating; vapor phase heating; or induction heating.

In some implementations, the adhesive comprises at least one of: silicone; urethane; acrylate; methacrylate; epoxy; cyanate ester resins; organic functional groups consisting essentially of: phenols, carboxylic acids, anhydrides, amides, and amines; sol-gel particles; alumina particles; nanoclay particles; and titania particles.

In some implementations, the plurality of electronic components are components of a ball grid array (BGA) comprising a plurality of solder balls, wherein populating the plurality of pads with a plurality of electronic components comprises mounting each of the plurality of solder balls of the BGA on a respective one of the plurality of pads.

In one embodiment, a printed circuit board assembly (PCBA), comprises: a printed circuit board (PCB) substrate comprising a plurality of pads, one of the plurality of pads comprising a through hole with a plated metal; a plurality of solder joints, each of the plurality of solder joints attached to a respective one of the plurality of pads; a plurality of electronic components, each of the plurality of electronic components attached to a respective one of the plurality of solder joints; and an adhesive cross-linked between the PCB substrate and the plurality of electronic components to reduce a differential of expansion between the plated metal and a portion of the PCB substrate that is not plated to prevent hot tearing of a solder joint attached to the pad comprising the through hole with the plated metal.

In one embodiment, a printed circuit board assembly (PCBA) is formed by a process, the process comprising: introducing an adhesive to a printed circuit board (PCB), wherein the PCB comprises a plurality of pads, one of the plurality of pads comprising a through hole with a plated metal; populating the plurality of pads with a plurality of electronic components; and forming a printed circuit board assembly (PCBA) by heating and then cooling the plurality of pads populated with the plurality of electronic components, wherein the PCBA comprises a plurality of solder joints, wherein each solder joint of the plurality of solder joints is formed between a respective one of the pads of the plurality of pads and an electronic component of the plurality of electronic components, wherein the adhesive prevents a solder joint coupled to the pad with the through hole from tearing when reheating the PCBA.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

A combination of VIPPO and non-VIPPO pads in PCBAs is increasingly used in the design and assembly for printed circuit boards (PCBs) for the construction of higher performance printed circuit board assemblies (PCBAs). The problem of mismatched CTEs between disparate materials has been introduced by the combination of VIPPO and non-VIPPO pads for PCBs, where the combination has gained significant usage by the industry. As described above, the first and second attempts to remedy mismatched CTEs lead to solder joint failures and require laborious solutions, respectively. The increasingly digital nature of the modern world necessitates improvements in PCBA technology. Increasingly, PCB utilize plate-through-hole (PTH) packaging. The material used to plate the insides of a PTH package is commonly Cu. The CTE of Cu is 17 parts-per-million (ppm)/degrees Celsius (° C.) whereas the CTE of an FR-4 PCB is 50 ppm/° C. When heated, the Cu in the PTH restricts the expansion of FR-4 PCB in the Z (vertical) direction due to the limited expansion of Cu in comparison to FR-4 PCB. The mismatched CTEs result in a non-uniform surface topology on the FR-4 PCB containing "hills and valleys" (as opposed to a more uniform surface topology) that may lead to hot tearing (i.e., solder joint failures).

Embodiments described herein are directed to eliminating or reducing non-uniform surface topologies and solder joint failure for a PCBA including a PCB containing VIPPO pads and non-VIPPO pads by applying an adhesive during formation of the PCBA. The adhesive may be designed to: (i) not cure before metallic wetting of solder (e.g., solder spheres) to substrate pads; and (ii) distribute stresses caused by the materials with mismatched CTEs contained within PCBs composed of a combination of VIPPO and non-VIPPO pads. In turn, a more uniform surface topology on the PCB substrate may be achieved despite the CTE mismatch, which reduces or eliminates hot tearing of the solder joints on VIPPO pads during subsequent reheating. The need to perform tedious steps (e.g., offline processing of cured systems and additional reflowing steps) to address mismatched CTEs may be reduced or eliminated by using the methods and systems described herein.

Figure 1:
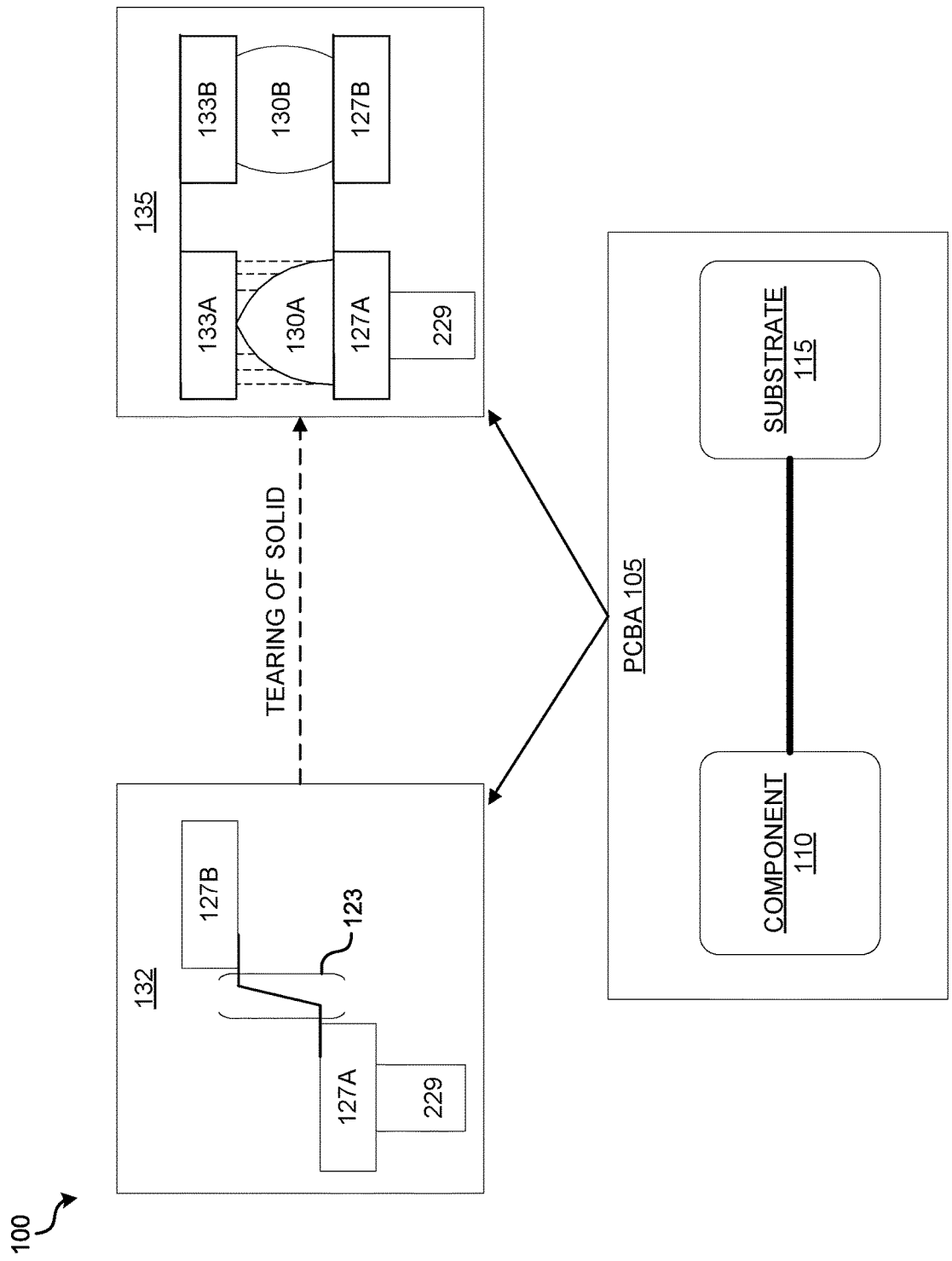
FIG. 1 is a block diagram depicting the resulting scenarios from omitting the adhesive into a printed circuit board assembly (PCBA) unit.

FIG. 1 is a block diagram depicting the resulting scenarios from omitting the adhesive into a PCBA unit. System 100 illustrates a PCBA unit that does not contain the adhesive, of which a more detailed example is described with respect to FIG. 3. PCBA 105 contains component 110 and substrate 115. A plurality of solder joints 130A and 130B may be formed to couple component 110 to substrate 115.

Section 132 depicts a differential in expansion induced by a CTE mismatch between pad 127A and pad 127B, where the differential in expansion between the pads is enclosed within brackets denoted as terrace 123. The taller the bracket, the larger the differential in expansion is between pad 127A and pad 127B. Upon exposing the solid-state solder joints to elevated temperatures and subsequent cooling steps, section 135 depicts the following: (i) solder joint 130A touches pad 133A; (ii) solder joint 130A is no longer attached to pad 133A; (iii) solder joint 130A remains attached to pad 127A; and (iv) solder joint 130B remains attached to pads 127B and 133B. Solder joint 130B, which is attached to pads 127B and 133B, facilitates more effective and efficient electrical connectivity within PCBA 105 than solder joint 130A, which is attached only to pad 133B and merely touches upon pad 133A. The dashed regions around solder joint 130A indicate the areas removed when solder joint 130A severs from the solder joints of pad 133A via hot tearing. The removed areas from solder joint 130A, if attached to pad 133A in section 135, would allow for more effective and efficient electrical connectivity within PCBA 105.

Figure 2:
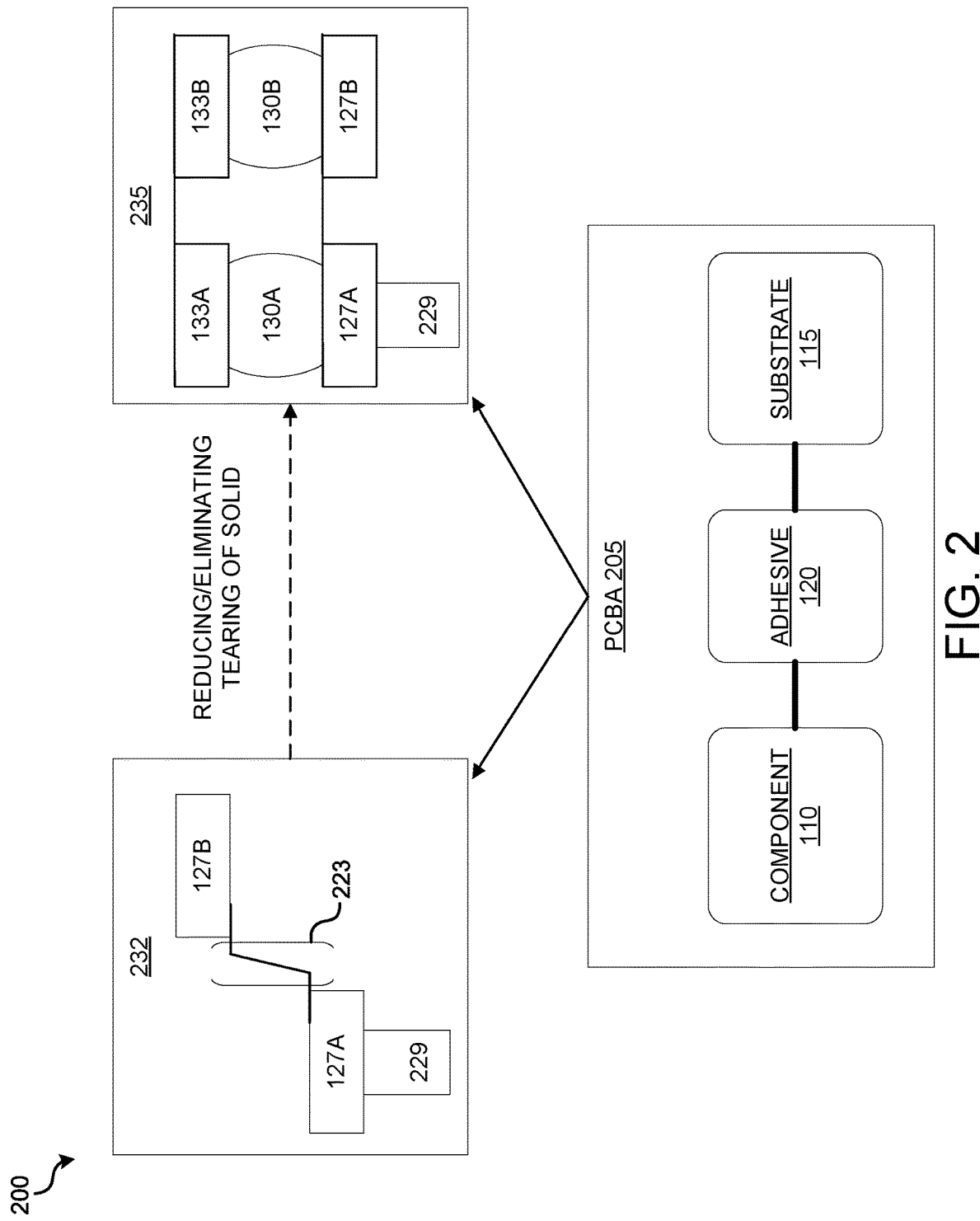
FIG. 2 is a block diagram depicting the resulting scenarios from incorporating the adhesive into a PCBA unit, in accordance with implementations of the disclosure.

FIG. 2 is a block diagram depicting the resulting scenarios from incorporating an adhesive into a PCBA unit, in accordance with implementations of the disclosure. System 200 illustrates a PCBA containing adhesive 120, examples of which are described in greater detail with reference to FIGS. 4, 5A, and 5B. In particular, PCBA 205 contains component 110, adhesive 120, and substrate 115. Adhesive 120 is an adhesive material applied between the surface of the PCB (e.g., substrate 115) and the component (e.g., component 110) that reinforces the solder joints of VIPPO and non-VIPPO pads to prevent hot tearing caused by the CTE mismatch.

Adhesive 120 comprises at least one or a combination among: a matrix material, silicone, urethane, acrylate, methacrylate, cyanate ester resins, chemical entities with cross-linking functional groups, epoxy, fluxing agents (e.g., organic acids, organic anhydrides, organic amines, and halogen containing compounds), crosslinking agents, curing agents, sol-gel particles, alumina particles, nanoclay particles, and titania particles. The identification of hot tearing on the first side of the PCBA is a tedious process requiring the first side and the second side of a PCBA be examined. Adhesive 120 may obviate the need to examine the first side and second side of a PCBA for hot tearing.

In an embodiment, adhesive 120 may be used with traditional underfill products to address "hot tearing" resulting from a CTE mismatch between VIPPO pads and non-VIPPO pads on a PCB. Additionally, the application of adhesive 120 on VIPPO pads may reduce or even eliminate the need for solder paste or conventional fluxes applied on VIPPO pads during reflow soldering. Offline processing steps required for underfill treated PCBAs are not required by utilizing adhesive 120. Stated another way, the use of adhesive 120 requires less processing steps to furnish a desired PCBA (i.e., a PCBA containing section 235 instead of a PCBA containing section 135).

In some embodiments, component 110 comprises non-VIPPO pads; active electronic devices (e.g., BGA packages, chip scale packages, and Flip Chip packages); passive electronic devices (e.g., resistors, capacitors, and light emitting diodes); and non-electronic parts (e.g., electrical connectors, battery clips, heat sinks, and relays). In some embodiments, substrate 115 comprises VIPPO pads including metal plated through holes; and non-VIPPO pads. By virtue of PCBA 205 incorporating adhesive 120, examples of which are described in further detail with respect to FIGS. 4, 5A, and 5B, the solder joints (e.g., solder joint 130A in section 235), are not torn from the solder joints of component 110 while staying attached to the solder joints of VIPPO pads of substrate 115 when exposed to additional heating operations after initial formation of the PCBA. In contrast to solder joint 130A in section 135 of FIG. 1, solder joint 130A in section 235 of FIG. 2 is attached to both the solder joints of the VIPPO and non-VIPPO pads.

Section 232 depicts a differential in expansion induced by a CTE mismatch between pad 127A and pad 127B, wherein the differential is enclosed within brackets denoted as terrace 223. Terrace 123 in section 132 of FIG. 1 is taller than terrace 223 in section 232 of FIG. 2. Thus, the differential in expansion induced by the CTE mismatch in PCBA 205, which incorporates adhesive 120, is less than PCBA 105, which does not incorporate adhesive 120. Upon exposing the solid-state solder joints to elevated temperatures and subsequent cooling steps, section 235 depicts the following: (i) solder joint 130A remains attached to pads 127A and 133A; and (ii) solder joint 130B remains attached to pads 127B and 133B. Solder joint 130B, which is attached to pads 127B and 133B, is equally effective and efficient at facilitating electrical connectivity within PCBA 205 to solder joint 130A, which is attached to pads 127A and 133A. In contrast to section 235, solder joint 130A in section 135 merely touches upon pad 133A without the formation of a metallic bond or completely separates from it. The omission of dashed regions around solder joint 130A in section 235 indicates that areas of solder joint 130A are not severed from pad 133A via hot tearing. Adhesive 120 is a material combining a solder fluxing mechanism and physical reinforcement to furnish the variant of solder joint 130A depicted in section 235, instead of the variant of solder joint 130A depicted in section 135. Furthermore, the variant of solder joint 130A depicted in section 235 indicates the reduction or elimination of hot tearing, which occurs with the variant of solder joint 130A in section 135.

Figure 3:
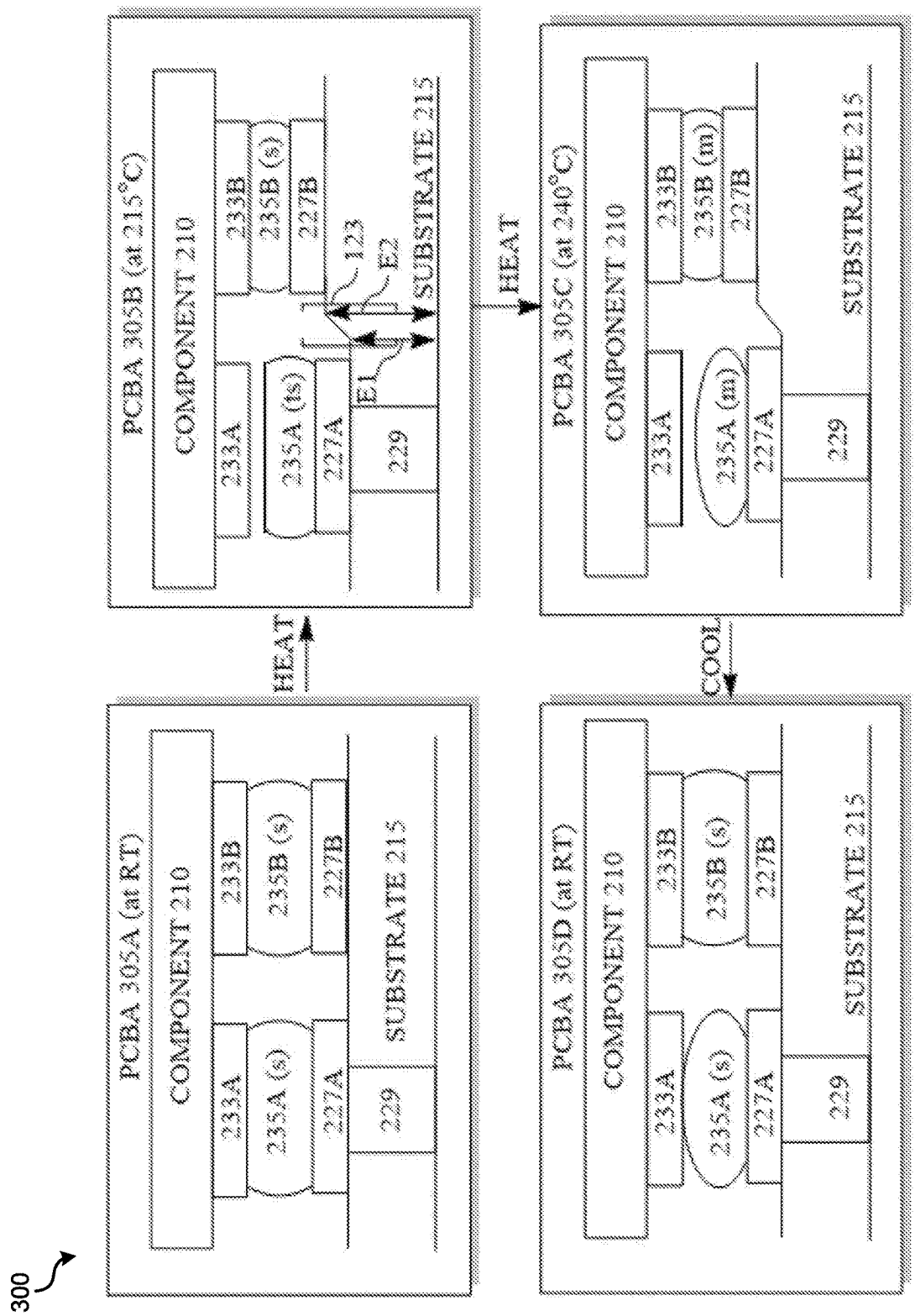
FIG. 3 shows a block diagram of a PCBA without incorporating an adhesive during steps of a subsequent reflow process or reheat flow.

FIG. 3 shows a block diagram of a PCBA 305 without incorporating an adhesive during steps of a reflow process flow 300. Process flow 300 illustrates one example of a more detailed representation (i.e., PCBA 305) of the structural elements within PCBA 105 in FIG. 1 at different temperatures. The notation of PCBA 305A, PCBA 305B, PCBA 305C, and PCBA 305D represents different instances of PCBA 305 at different times and temperatures during a second reflow.

PCBA 305A depicts a heat assembled component 210 attached to a substrate 215 by a first interconnection including a VIPPO pad 227A and a second interconnection including non-VIPPO pad 227B at room temperature. The first interconnection in PCBA 305A includes a stack of pad 233A, solder joint 235A(s), and VIPPO pad 227A with metal-plated through-hole 229 (hereinafter "metal 229"); and the second interconnection in PCBA 305A includes a stack of pad 233B, solder joint 235B(s), and non-VIPPO pad 227B. Component 210 in PCBA 305A connects to the first interconnection and the second interconnection at pads 233A and 233B, respectively. Substrate 215 in PCBA 305A connects to the first interconnection and the second interconnection at pads 227A and 227B, respectively. Solder joint 235A(s) of the first interconnection in PCBA 305A is attached to pads 227A and 233A, where the "s" in parenthesis indicates that solder joint 235A is in the solid-state. Solder joint 235B(s) of the second interconnection in PCBA 305A is attached to pads 227B and 233B, where the "s" in parenthesis indicates that solder joint 235B is in the solid-state.

PCBA 305B depicts the resulting arrangement of structures in PCBA 305 upon heating PCBA 305 from room temperature (RT) to 215° C. during a second reflow, where a heat assembled component (e.g., component 210) is attached to a first interconnection and a second interconnection. Substrate 215 in PCBA 305B connects to the first VIPPO interconnection and the second non-VIPPO interconnection at pads 227A and 227B, respectively. Solder joint 235A(ts) of the first interconnection in PCBA 305B is attached to VIPPO pad 227A and torn away from pad 233A, where the "ts" in parenthesis indicates that solder joint 235A is a torn solid-state material. Solder joint 235B(s) of the second interconnection in PCBA 305B is attached to pads 227B and 233B, where the "s" in parenthesis indicates that solder joint 235B is in the solid-state. As depicted in PCBA 305B, solder joint 235A is severed from pad 233A on the component side (e.g., component 210) upon heating PCBA 305 from RT to 215° C. At 215° C., solder joints 235A and 235B in PCBA 305 are still in the solid-state. PCBA 305B is observed when adhesive 120 is not incorporated in the PCBA, as also depicted in FIG. 1. Terrace 123 in PCBA 305B represents: (i) the differential in expansion of dimensions resulting from the CTE mismatch between metal 229 and substrate 215; and (ii) resulting disconnect/failure that leads to "heat tearing" (as described with respect to FIGS. 1 and 2), where "E1" depicts the height of the substrate 215 in the area underneath VIPPO pad 227A and "E2" depicts the height of the substrate 215 in the area underneath non-VIPPO pad 227B. In PCBA 305B, "E2" is depicted as taller in height than "E1" to demonstrate that metal 229 expands less than the rest of substrate 215 due to the CTE mismatch between metal 229 and the bulk material of substrate 215.

PCBA 305C depicts the resulting arrangement of structures in PCBA 305 upon heating PCBA 305 from 215° C. to 240° C. during a second reflow, where a heat assembled component (e.g., component 210) is attached to a first interconnection and a second interconnection. At 240° C., solder joints 235A and 235B in PCBA 305C are no longer in the solid-state and become molten materials. Solder joint 235A(m) of the first interconnection in PCBA 305C is attached to VIPPO pad 227A and detached from pad 233A, where the "m" in parenthesis indicates that solder joint 235A is a molten-state material. Solder joint 235B(m) of the second interconnection in PCBA 305C is attached to pads 227B and 233B, where the "m" in parenthesis indicates that solder joint 235B is in the molten-state. Stated another way, solder joints 235A and 235B in PCBA 305 are in a molten-state at 240° C. As depicted in PCBA 305C, solder joint 235A is a molten-state material severed from pad 233A on the component side (e.g., component 210) upon heating PCBA 305 from 215° C. to 240° C. PCBA 305C is observed when adhesive 120 is not incorporated in the PCBA, as also depicted in FIG. 1.

PCBA 305D depicts the resulting arrangement of structures in PCBA 305 upon cooling PCBA 305 from 240° C. to RT during a second reflow, a heat assembled component (e.g., component 210) is attached to a first interconnection and a second interconnection. By cooling from 240° C. to RT, solder joints 235A and 235B in PCBA 305D are transformed from the molten-state back to the solid-state. Component 210 in PCBA 305D connects to the first interconnection and the second interconnection at pads 233A and 233B, respectively. Substrate 215 in PCBA 305D connects to the first interconnection and the second interconnection at pads 227A and 227B, respectively. Solder joint 235A(s) of the first interconnection in PCBA 305D is attached to VIPPO pad 227A and touches against pad 233A without connecting to pad 233A, where the "s" in parenthesis indicates that solder joint 235A is a solid-state material. Solder joint 235B(s) of the second interconnection in PCBA 305D is attached to pads 227B and 233B, where the "s" in parenthesis indicates that solder joint 235B is in the solid-state. As depicted in PCBA 305D, solder joint 235A is a solid-state material severed from pad 233A on the component side (e.g., component 210) upon cooling PCBA 305 from 240° C. to RT. PCBA 305D is observed when adhesive 120 is not incorporated in the PCBA, as also depicted in FIG. 1. Because solder joint 235A(s) is not attached to pad 233A, the connection between VIPPO pad 227A and pad 233A is not as strong or conducive as the connection between non-VIPPO pad 227B and pad 233B.

Figure 4:
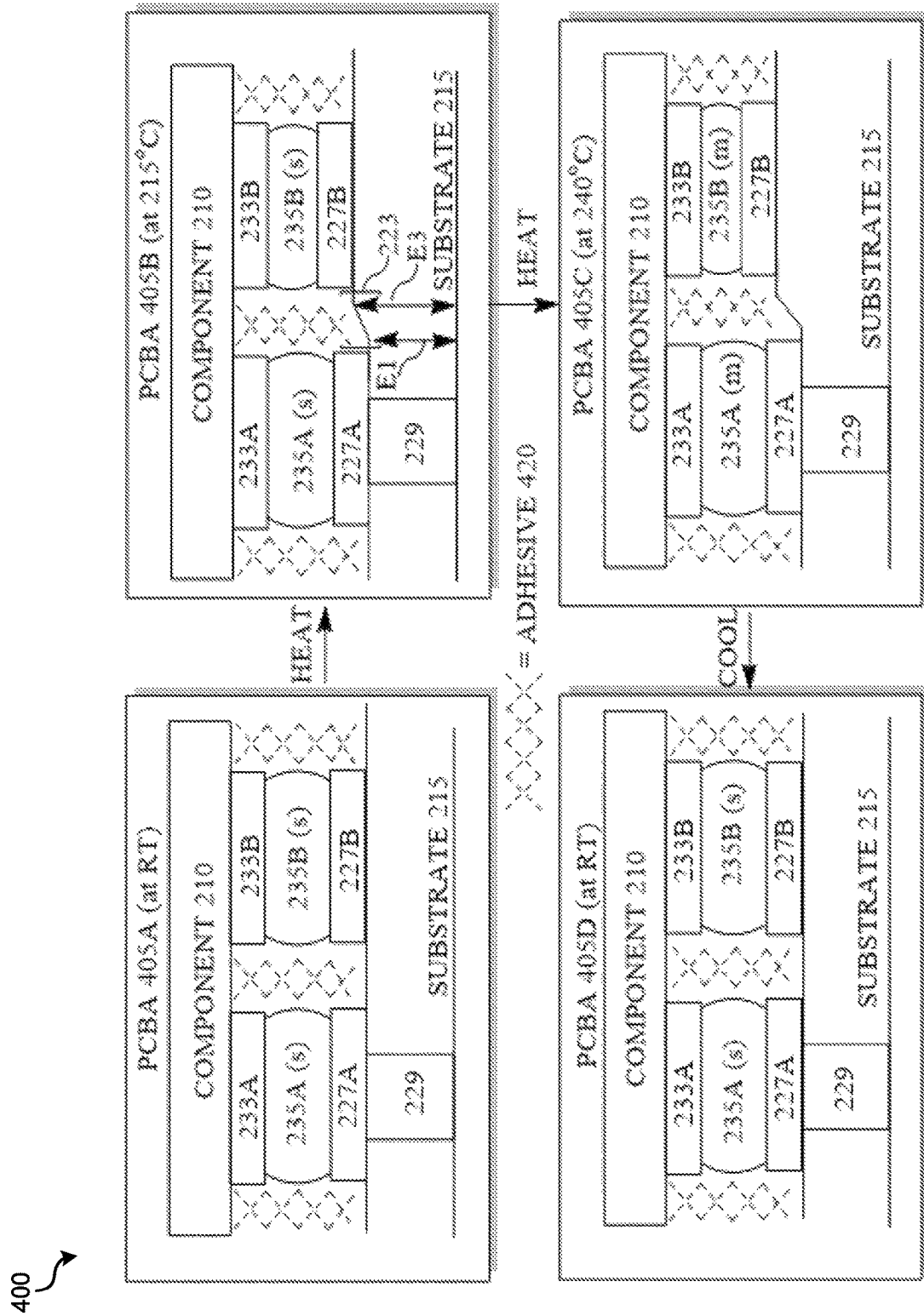
FIG. 4 shows a block diagram of a PCBA incorporating an adhesive during steps of a reflow process flow, in accordance with implementations of the disclosure.

FIG. 4 shows a block diagram of a PCBA 405 incorporating an adhesive during steps of a reflow process flow 400, in accordance with implementations of the disclosure. Process flow 400 illustrates one example of a more detailed representation of the structural elements within PCBA 205 in FIG. 2 at different temperatures. It should be appreciated that although two interconnections (a VIPPO interconnection adjacent a non-VIPPO interconnection) are illustrated in the example of FIG. 4, PCBA 405 may incorporate any number of interconnections, including VIPPO and non-VIPPO interconnections.

Although FIG. 4 illustrates a reflow process flow occurring at a first elevated temperature of 215° C. and a second elevated temperature of 240° C., it should be appreciated that the first elevated temperature and the second elevated temperature will be dependent on the solidus and liquidus temperatures of the alloy used to form the joint. In some embodiments, the first elevated temperature may be as low as 150° C. and the second elevated temperature may be as high as 300° C.

PCBA 405 may be identical or functionally equivalent to PCBA 205 in FIG. 2. The notation of PCBA 405A, PCBA 405B, PCBA 405C, and PCBA 405D represents different instances of PCBA 405 at different times and temperatures during a second reflow. In contrast to PCBA 305, PCBA 405 incorporates adhesive 420, wherein adhesive 420 may be identical and functionally equivalent to adhesive 120 in FIG. 2. Pads 233A and 233B may be identical or functionally equivalent to pads 133A and 133B in FIG. 2. Pads 227A and 227B may be identical or functionally equivalent to pads 127A and 127B in FIG. 2. Solder joints 235A and 235B may be identical or functionally equivalent to solder joints 130A and 130B in FIG. 2, respectively. Component 210 may be identical or functionally equivalent to component 110 in FIG. 2. Substrate 215 may be identical or functionally equivalent to substrate 115 in FIG. 2.

PCBA 405A depicts a heat assembled component (e.g., component 210) attached to a first VIPPO interconnection and a second non-VIPPO interconnection, at room temperature (RT). The first interconnection in PCBA 405A includes a stack of pad 233A, solder joint 235A(s), and VIPPO pad 227A with metal-plated through-hole 229 (hereinafter metal 229); and the second interconnection in PCBA 405A includes a stack of pad 233B, solder joint 235B(s), and non-VIPPO pad 227B. Component 210 in PCBA 405A connects to the first interconnection and the second interconnection at pads 233A and 233B, respectively. In contrast to PCBA 305A, PCBA 405A incorporates adhesive 420, wherein adhesive 420 is attached to substrate 215 and component 210. Substrate 215 in PCBA 405A connects to the first interconnection and the second interconnection at pads 227A and 227B, respectively. Solder joint 235A(s) of the first interconnection in PCBA 405A is attached to pads 227A and 233A, where the "s" in parenthesis indicates that solder joint 235A is in the solid-state. Solder joint 235B(s) of the second interconnection in PCBA 305A is attached to pads 227B and 233B, where the "s" in parenthesis indicates that solder joint 235B is in the solid-state. In an embodiment, the pads 227A-227B comprise a metal surface amenable for soldering (e.g., nickel gold, hot air solder levelling (HASL) finished Cu, electroless nickel immersion gold coating (ENIG), and organic surface protectant (OSP) plated Cu).

PCBA 405B depicts the resulting arrangement of structures in PCBA 405 upon heating PCBA 405 from RT to 215° C. during a second reflow, where a heat assembled component (e.g., component 210) is attached to a first interconnection and a second interconnection of PCBA 405B. In contrast to PCBA 305B, PCBA 405B incorporates adhesive 420, wherein adhesive 420 attaches component 210 to substrate 215. Solder joint 235A(s) of the first interconnection in PCBA 405B is attached to pads 227A and 233A, where the "s" in parenthesis indicates that solder joint 235A is a solid-state material. Solder joint 235B(s) of the second interconnection in PCBA 405B is attached to pads 227B and 233B, where the "s" in parenthesis indicates that solder joint 235B is in the solid-state. At 215° C., solder joints 235A and 235B in PCBA 405B are still in the solid-state and attached to pads 233A and 233B, respectively, by virtue of incorporating adhesive 420 in the PCBA, as also depicted in FIG. 2. In one particular embodiment, the CTE of metal 229 is 17 ppm/° C. and the CTE of substrate 215 is 44 ppm/° C., wherein metal 229 is Cu and substrate 215 is FR-4. In other embodiments, metal 229 may be nickel, gold and its alloys, a nickel alloy, a copper alloy, a solder such as a silver-derived solder or palladium derived solder, or any combination thereof.

Upon heating the PCBA from RT to 215° C., there is less of a differential in expansion along the Z-axis in PCBA 405B as compared with PCBA 305B. In contrast to PCBA 305B, solder joint 235A(s) in PCBA 405B remains attached to both pads 227A and 233A despite subsequent heating PCBA 405 from RT to 215° C. By virtue of PCBA 405 incorporating adhesive 420, the differential in expansion of metal 229 and substrate 215, as caused by the CTE mismatch, upon heating PCBA 405 from RT to 215° C., is not as pronounced as the differential in expansion in PCBA 305B. Stated another way, the adhesive reduces the differential in expansion. This is due, at least in part, to adhesive 420 reducing the stresses more evenly during the second heating. Terrace 223 represents the differential in expansion between pads 227A and 227B on substrate 215 due to the reduced CTE mismatch. In PCBA 405B, terrace 223 is depicted as shorter in height than terrace 123 to demonstrate that there is less of a differential in expansion in PCBA 405 than PCBA 305. The height difference between "E3" and "E1" is depicted as less than the height difference between "E1" and "E2" to demonstrate that the substrate in PCBA 405B expands less than the substrate PCBA 305B.

PCBA 405C depicts the resulting arrangement of structures in PCBA 405 upon heating PCBA 405 from 215° C. to 240° C. during a second reflow, where a heat assembled component (e.g., component 210) is attached to a first interconnection and a second interconnection of PCBA 405C. At 240° C., solder joints 235A and 235B in PCBA 405C are no longer in the solid-state and become molten-state materials. Component 210 in PCBA 405C connects to the first interconnection and the second interconnection at pads 233A and 233B, respectively. In contrast to PCBA 305B, PCBA 405B incorporates adhesive 420, wherein adhesive 420 is attached to substrate 215. Substrate 215 in PCBA 405C connects to the first interconnection and the second interconnection at pads 227A and 227B, respectively. Solder joint 235A(m) of the first interconnection in PCBA 405C is attached to pads 227A and 233A, where the "m" in parenthesis indicates that solder joint 235A is a molten-state material. Solder joint 235B(m) of the second interconnection in PCBA 405C is attached to pads 227B and 233B, where the "m" in parenthesis indicates that solder joint 235B is in the molten-state. Stated another way, solder joints 235A and 235B in PCBA 405C are in a molten-state at 240° C. In contrast to PCBA 305C, solder joint 235A is molten state material not severed from pad 233A on the component side (e.g., component 210) upon heating PCBA 405 from 215° C. to 240° C., by virtue of incorporating adhesive 420 in the PCBA, as also depicted in FIG. 2.

PCBA 405D depicts the resulting arrangement of structures in PCBA 405 upon cooling PCBA 405 from 240° C. to RT during a second reflow, a heat assembled component (e.g., component 210) is attached to a first interconnection and a second interconnection of PCBA 405. By cooling from 240° C. to RT, solder joints 235A and 235B in PCBA 405D are transformed from the molten-state back to the solid-state. In contrast to PCBA 305D, PCBA 405D incorporates adhesive 420, wherein adhesive 420 is attached to substrate 215. Substrate 215 in PCBA 405D connects to the first interconnection and the second interconnection at pads 227A and 227B, respectively. Solder joint 235A(s) of the first interconnection in PCBA 405D is attached to pads 227A and pad 233A, where the "s" in parenthesis indicates that solder joint 235A is a solid-state material. Solder joint 235B(s) of the second interconnection in PCBA 405D is attached to pads 227B and 233B, where the "s" in parenthesis indicates that solder joint 235B is in the solid-state. In contrast to PCBA 305D, solder joint 235A in PCBA 405D is not severed from pad 233A on the component side (e.g., component 210) upon cooling PCBA 405 from 240° C. to RT, as also depicted in FIG. 2. Stated another way, solder joint 235A is attached to pads 227A and 233A in PCBA 405D, whereas solder joint 235A is attached only to pad 233A in PCBA 305D. A stronger or more conducive connection between pads 233A and 227A is established by virtue of the adhesive 420 reducing the differential of expansion between the VIPPO and non-VIPPO locations, as observed in PCBA 405D, instead of solder joint 235A(s) attached only to VIPPO pad 227A, as observed in PCBA 305D.

Figures 5A, 5B:
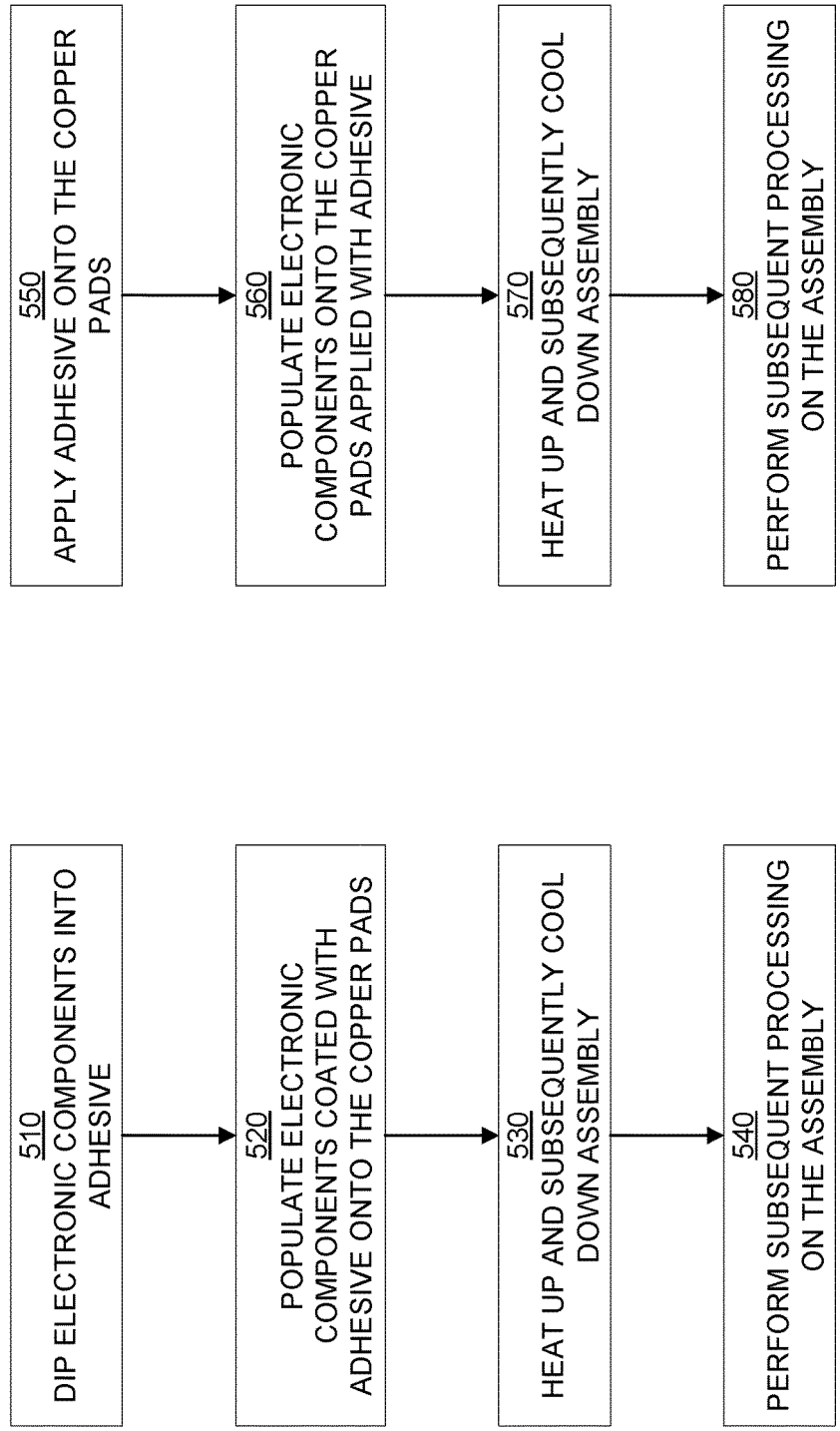
FIG. 5A is an operational flow diagram illustrating an example of a method for reducing hot tearing in a PCBA using an adhesive, in accordance with implementations of the disclosure.
FIG. 5B is an operational flow diagram illustrating another example of a method for reducing hot tearing in a PCBA using an adhesive, in accordance with implementations of the disclosure.

FIG. 5A is an operational flow diagram illustrating an example method 500A for reducing hot tearing, in accordance with implementations of the disclosure.

Operation 510 involves dipping electronic components into an adhesive. This adhesive may be identical or functionally equivalent to adhesive 120 in FIG. 2 and adhesive 420 in FIG. 4; and the electronic components may be identical or functionally equivalent to component 110 in FIG. 2 and component 210 in FIG. 4. Automated equipment may be used to dip component 210 into adhesive 420 in order to coat the entirety of component 210 in adhesive 420.

In an embodiment, a matrix material in adhesive 420 provides a more uniform plane across substrate 215 by reinforcing the solder joint from component 210 to PCB substrate 215. In some implementations, the matrix material in adhesive 420 may contain a thermosettable flux (e.g., polyimide fluxes, polyurethanes fluxes epoxy fluxes, silicone fluxes, and combinations thereof) to remove oxide impurities, while being amenable to cross-linking after reflow.

Operation 520 involves populating electronic components coated with adhesive onto the copper pads. In an embodiment, component 210, which has been coated with adhesive 420, is placed on the copper pads (e.g., pads 227A, 227B) residing within PCB substrate 215 by automated equipment. In some implementations, solder paste is applied on the copper pads prior to placement. For example, if component 210 is a BGA comprising a plurality of solder balls, each of the solder balls of the BGA may be placed onto corresponding solder-paste coated pads of the PCB substrate 215. As another example, one or more solder preforms may be placed on each of the solder pads, and the component may be placed on the preforms over the pads of the PCB. As a further example, a sintering paste may be placed on pads on the PCB.

Operation 530 involves heating up and subsequently cooling down the assembly to form solder joints (or sintering joints) between the component and PCB. PCB substrate 215, which contains placed component 210 coated with adhesive 420, may be heated gradually to a suitable temperature (e.g., from a temperature of 215° C. to 240° C.) followed by gradual cooling to room temperature to form PCBA 405 including solidified solder joints. More specifically, operation 520 may lead to the desired assembly of PCBA 405A in FIG. 4. The heating processes to form PCBA 405A may be achieved by convection, infra-red, vapor phase, or induction heating, where PCBA 405 incorporates adhesive 420 that may be cross-linked to substrate 215 and component 210. In some implementations, ultraviolet light may also be used to cross-link adhesive 420 to substrate 215 and component 210. Depending on the composition of adhesive 420, substrate 215, and component 210, certain wavelengths of ultraviolet light may lead to more efficient cross-linking of adhesive 420 to substrate 215 and component 210. Free-radical reactions, cationic initiated reactions, anionic initiated reactions, and electron beams, or combination thereof may be used to cross-link adhesive 420 to substrate 215 and component 210. The cross-linked variant of adhesive 420 to substrate 215 and component 210 may reduce or eliminate hot tearing in PCBA 405.

Operation 540 involves performing subsequent processing on the PCBA that heats the PCBA. For example, subsequent reflow processing may be performed on the assembly. In an embodiment, the assembly (e.g., PCBA 405) in operation 540 corresponds to PCBA 405A, which incorporates adhesive 420. Heating the assembly to 215° C. leads to PCBA 405B, which exhibits less of a differential in expansion despite the CTE mismatch between metal 229 and substrate 215, as opposed to PCBA 305B, which does not incorporate adhesive 420. Further heating of the assembly to 240° C. leads to PCBA 405C, where molten solder joints 235A and 235B are attached to each of the respective pads, as opposed to PCBA 305C, where molten solder joint 235B is attached to each of the respective pads and molten solder joint 235A is attached to only one of the respective pads. Convection, infra-red, vapor phase, or induction provide the heating profiles required for obtaining PCBA 405B and PCBA 405C, where adhesive 420 is cross-linked to substrate 215 and component 210 during the subsequent reflow processing. In an embodiment, the heating profiles for exposing PCBA 405 are most efficiently achieved by using convection techniques to yield PCBA 405B and PCBA 405C, respectively. Alternatively, PCBA 405 may be exposed to ultraviolet light for cross-linking adhesive 420 to substrate 215 and component 210 during the subsequent reflow processing. Cooling the assembly from 240° C. to room temperature leads to PCBA 405D, where solid solder joints 235A and 235B are attached to each of the respective pads, as opposed to PCBA 305D, where solid solder joint 235B is attached to each of the respective pads and solid solder joint 235A is attached to only one of the respective pads. Stated another way, adhesive 420 is amenable to the heating conditions that PCBA 405 is exposed to eliminate hot tearing.

FIG. 5B is an operational flow diagram illustrating an example method 500A for reducing hot tearing.

Operation 550 involves applying adhesive onto the substrate/PCB. This adhesive may be identical or functionally equivalent to adhesive 120 in FIG. 2 and adhesive 420 in FIG. 4; and the electronic components may be identical or functionally equivalent to component 110 in FIG. 2 and component 210 in FIG. 4. Automated equipment may be used to apply adhesive 420 onto the PCB in order to uniformly distribute adhesive 420. The adhesive may be applied onto the pads of the PCB (e.g., pads 227A, 227B), between the pads, or both (e.g., throughout the substrate). Printing, jetting, spraying, or dispensing techniques may be used to apply the adhesive. In an embodiment, the entirety of the surface of the copper pads is coated with adhesive 420 such that the resulting space between substrate 215 and component 210, upon populating component 210 onto PCB 405, is optimally filled with adhesive 420.

Operation 560 involves populating electronic components onto the copper pads after applying the adhesive. In an embodiment, component 210 is placed on the copper pads (e.g., pads 227A, 227B) by automated equipment. In some implementations, solder paste is applied on the copper pads prior to placement. For example, if component 210 is a BGA comprising a plurality of solder balls, each of the solder balls of the BGA may be placed onto corresponding solder-paste coated pads of PCB substrate 215. As another example, one or more solder preforms may be placed on each of the solder pads, and pads of the component may be placed on the preforms over the pads of PCB substrate 215. As a further example, a sintering paste may be placed on pads on PCB substrate 215.

Operation 570 involves heating up and subsequently cooling down the assembly to form solder joints (or sintering joints) between the component and PCB. This results in the formation of the PCBA (e.g., PCBA 405). Operation 570 may be performed similarly to operation 530, as discussed above with reference to method 500A.

Operation 580 involves performing subsequent processing on the PCBA that heats the PCBA. Operation 580 may be performed similarly to operation 540, as discussed above with reference to method 500A.

It should be appreciated that although methods 500A and method 500B are illustrated as two separate methods for reducing hot tearing in a PCBA, in some implementations, methods 500A and 500B may be combined. For example, in some implementations, adhesive may be applied on both the electronic components and PCB prior to formation of the PCBA. Additionally, in some implementations adhesive may be applied after populating the electronic components onto the copper pads, and before heating up and subsequently cooling down the assembly.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A printed circuit board assembly (PCBA), comprising:
a printed circuit board (PCB) substrate comprising a plurality of pads, the plurality of pads comprising a via-in-pad plated over (VIPPO) pad and a non-VIPPO pad, wherein there is a coefficient of thermal expansion mismatch between the PCB and a metal plating a through hole of the VIPPO pad;
a plurality of solder joints, each of the plurality of solder joints attached to a respective one of the plurality of pads;
a plurality of electronic components, each of the plurality of electronic components attached to a respective one of the plurality of solder joints;
an adhesive cross-linked between the PCB substrate and the plurality of electronic components, the adhesive configured to reduce a differential in thermal expansion of the PCB between the VIPPO pad and the non-VIPPO pad caused by the coefficient of thermal expansion mismatch, thereby preventing a solder joint attached to the VIPPO pad from tearing when reheating the PCBA during a reflow soldering process.

2. A printed circuit board assembly (PCBA) formed by a process, the process comprising:
introducing an adhesive to a printed circuit board (PCB), wherein the PCB comprises a plurality of pads, the plurality of pads comprising a via-in-pad plated over (VIPPO) pad and a non-VIPPO pad, wherein there is a coefficient of thermal expansion mismatch between the PCB and a metal plating a through hole of the VIPPO pad;
populating the plurality of pads with a plurality of electronic components;
forming a printed circuit board assembly (PCBA) by performing a first reflow soldering process that heats and then cools the plurality of pads populated with the plurality of electronic components to form a plurality of solder joints, wherein each solder joint of the plurality of solder joints is formed between a respective one of the pads of the plurality of pads and an electronic component of the plurality of electronic components, wherein the adhesive is configured to reduce a differential in thermal expansion of the PCB between the VIPPO pad and the non-VIPPO pad caused by the coefficient of thermal expansion mismatch, thereby preventing a solder joint attached to the VIPPO pad from tearing when reheating the PCBA during a second reflow soldering process.

3. A method, comprising:
introducing an adhesive to a printed circuit board (PCB), wherein the PCB comprises a plurality of pads, the plurality of pads comprising a via-in-pad plated over (VIPPO) pad and a non-VIPPO pad, wherein there is a coefficient of thermal expansion mismatch between the PCB and a metal plating a through hole of the VIPPO pad;
populating the plurality of pads with a plurality of electronic components;
forming a printed circuit board assembly (PCBA) by performing a first reflow soldering process that heats and then cools the plurality of pads populated with the plurality of electronic components to form a plurality of solder joints, wherein each solder joint of the plurality of solder joints is formed between a respective one of the pads of the plurality of pads and an electronic component of the plurality of electronic components; and
after forming the PCBA, performing a second reflow soldering process that heats the PCBA, wherein during heating of the PCBA, the adhesive reduces a differential in thermal expansion of the PCB between the VIPPO pad and the non-VIPPO pad caused by the coefficient of thermal expansion mismatch, thereby preventing a solder joint coupled to the VIPPO pad from tearing when heating the PCBA.

4. The method of claim 3, wherein introducing the adhesive to the PCB, comprises:
dipping the plurality of electronic components in the adhesive to yield a plurality of electronic components coated with the adhesive; and
populating the plurality of pads with the plurality of electronic components coated with the adhesive.

5. The method of claim 3, wherein:
introducing the adhesive to the PCB, comprises: applying the adhesive onto the PCB to yield a plurality of pads containing the adhesive; and
populating the plurality of pads with the plurality of electronic components, comprises: populating the plurality of pads containing the adhesive with the plurality of electronic components.

6. The method of claim 5, wherein:
introducing the adhesive to the PCB, comprises: applying the adhesive onto the plurality of pads containing solder paste to yield a plurality of pads containing the adhesive and the solder paste; and
populating the plurality of pads with the plurality of electronic components, comprises: populating the plurality of pads containing the adhesive and the solder paste with the plurality of electronic components.

7. The method of claim 3, wherein performing the second reflow soldering process that heats the PCBA, comprises:
heating the PCBA to a first elevated temperature from room temperature;
heating the PCBA to a second elevated temperature from room temperature; and
cooling the PCBA back to room temperature.

8. The method of claim 7, wherein heating the PCBA to the second elevated temperature from room temperature, comprises:
transforming the plurality of solder joints to a molten state solder; and
maintaining an attachment of the plurality of solder joints to the plurality of pads in the molten state solder.

9. The method of claim 7, wherein forming the PCBA comprises: applying convection heating, infra-red heating, vapor phase heating, or induction heating.

10. The method of claim 3, wherein the plated metal comprises copper, nickel, gold, solder, a copper alloy, a gold alloy, or a nickel alloy.

11. The method of claim 3, wherein during the second reflow soldering process, the PCBA is heated within a range from 150° C. to 300° C.

12. The method of claim 3, wherein the adhesive comprises a cross-linking agent, wherein after forming the PCBA, the adhesive is cross-linked.

13. The method of claim 12, further comprising: cross-linking the adhesive by applying radiation, wherein the radiation comprises at least one of: electron beam radiation and ultraviolet radiation.

14. The method of claim 12, further comprising: cross-linking the adhesive by exposing the adhesive to at least one of: free-radical initiated reactions, cationic initiated reactions, and anionic initiated reactions.

15. The method of claim 3, wherein the adhesive comprises a curing agent, wherein after forming the PCBA, the adhesive is cured.

16. The method of claim 3, wherein the VIPPO pad contains at least one of:
   a copper finish on a surface of the VIPPO pad;
   a nickel gold finish on the surface of the VIPPO pad;
   a hot air solder levelling finish on the surface of the VIPPO pad;
   an electroless nickel with immersion gold coating on the surface of the VIPPO pad; and
   an organic surface protect (OSP) finish on the surface of the VIPPO pad.

17. The method of claim 3, wherein the adhesive comprises at least one of: silicone; urethane; acrylate; methacrylate; epoxy; cyanate ester resins; organic functional groups consisting essentially of: phenols, carboxylic acids, anhydrides, amides, and amines; sol-gel particles; alumina particles; nanoclay particles; and titania particles.

18. The method of claim 3, wherein the plurality of electronic components are components of a ball grid array (BGA) comprising a plurality of solder balls, wherein populating the plurality of pads with the plurality of electronic components comprises mounting each of the plurality of solder balls of the BGA on a respective one of the plurality of pads.

19. The method of claim 3, wherein the adhesive comprises a solder flux, wherein forming the PCBA comprises: the adhesive providing solder fluxing during the first reflow soldering process.

\* \* \* \* \*